United States Patent
Yu et al.

(10) Patent No.: US 11,527,419 B2
(45) Date of Patent: Dec. 13, 2022

(54) PHOTONIC INTEGRATED PACKAGE AND METHOD FORMING SAME

(71) Applicant: Taiwan Semiconductor Manufacturing Co., Ltd., Hsinchu (TW)

(72) Inventors: Chen-Hua Yu, Hsinchu (TW); An-Jhih Su, Taoyuan (TW); Wei-Yu Chen, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 29 days.

(21) Appl. No.: 17/020,245

(22) Filed: Sep. 14, 2020

(65) Prior Publication Data

US 2020/0411333 A1    Dec. 31, 2020

Related U.S. Application Data

(63) Continuation of application No. 16/290,028, filed on Mar. 1, 2019, now Pat. No. 10,777,430.

(Continued)

(51) Int. Cl.
*H01L 21/56* (2006.01)
*H01L 23/00* (2006.01)
(Continued)

(52) U.S. Cl.
CPC .......... *H01L 21/561* (2013.01); *G02B 6/1225* (2013.01); *G02B 6/136* (2013.01);
(Continued)

(58) Field of Classification Search
CPC ............. H01L 21/561; H01L 21/28167; H01L 21/823807; H01L 21/823857; H01L 23/3121; H01L 23/3171; H01L 23/5226; H01L 23/5283; H01L 23/5383; H01L 23/5386; H01L 24/09; H01L 24/17;
(Continued)

(56) References Cited

U.S. PATENT DOCUMENTS 9,048,233 B2   6/2015 Wu et al.
9,111,949 B2   8/2015 Yu et al.
(Continued)

FOREIGN PATENT DOCUMENTS

EP    2696229 A2    2/2014
JP    2015204456 A   11/2015
(Continued)

*Primary Examiner* — Nikolay K Yushin
(74) *Attorney, Agent, or Firm* — Slater Matsil, LLP

(57) ABSTRACT

A method includes placing an electronic die and a photonic die over a carrier, with a back surface of the electronic die and a front surface of the photonic die facing the carrier. The method further includes encapsulating the electronic die and the photonic die in an encapsulant, planarizing the encapsulant until an electrical connector of the electronic die and a conductive feature of the photonic die are revealed, and forming redistribution lines over the encapsulant. The redistribution lines electrically connect the electronic die to the photonic die. An optical coupler is attached to the photonic die. An optical fiber attached to the optical coupler is configured to optically couple to the photonic die.

20 Claims, 26 Drawing Sheets

Related U.S. Application Data

(60) Provisional application No. 62/690,770, filed on Jun. 27, 2018.

(51) Int. Cl.
*H01L 23/31* (2006.01)
*H01L 23/522* (2006.01)
*H01L 23/528* (2006.01)
*H01L 23/538* (2006.01)
*G02B 6/30* (2006.01)
*G02B 6/122* (2006.01)
*G02B 6/136* (2006.01)

(52) U.S. Cl.
CPC ............ *G02B 6/30* (2013.01); *H01L 23/3121* (2013.01); *H01L 23/3171* (2013.01); *H01L 23/5226* (2013.01); *H01L 23/5283* (2013.01); *H01L 23/5383* (2013.01); *H01L 23/5386* (2013.01); *H01L 24/09* (2013.01); *H01L 24/17* (2013.01); *H01L 24/32* (2013.01); *H01L 24/73* (2013.01); *H01L 2224/0231* (2013.01); *H01L 2224/02373* (2013.01); *H01L 2924/1433* (2013.01)

(58) Field of Classification Search
CPC . H01L 24/32; H01L 24/73; H01L 2224/0231; H01L 2224/02373; H01L 2924/1433; G02B 6/1225; G02B 6/136; G02B 6/30
See application file for complete search history.

(56) References Cited

U.S. PATENT DOCUMENTS

| | | | |
|---|---|---|---|
| 9,543,226 | B1 | 1/2017 | Nuttall |
| 9,899,355 | B2 | 2/2018 | Yuan et al. |
| 10,162,139 | B1 | 12/2018 | Wang et al. |
| 10,388,608 | B2 | 8/2019 | Mitsukura et al. |
| 10,510,674 | B2 | 12/2019 | Lin et al. |
| 10,527,790 | B2 * | 1/2020 | Potluri ................ G02B 6/4239 |
| 2010/0290790 | A1 | 11/2010 | Murthy et al. |
| 2015/0295098 | A1 | 10/2015 | Toda |
| 2016/0197111 | A1 | 7/2016 | Coolbaugh et al. |
| 2017/0131469 | A1 | 5/2017 | Kobrinsky et al. |
| 2017/0186670 | A1 | 6/2017 | Budd et al. |
| 2017/0269305 | A1 | 9/2017 | Heroux |
| 2018/0180808 | A1 | 6/2018 | Zhang et al. |
| 2019/0179079 | A1 | 6/2019 | Potluri et al. |
| 2019/0259677 | A1 | 8/2019 | Lasiter et al. |
| 2019/0324223 | A1 * | 10/2019 | Yim ........................ H01L 23/00 |
| 2019/0326266 | A1 | 10/2019 | Traverso et al. |

FOREIGN PATENT DOCUMENTS

| | | |
|---|---|---|
| TW | 201412040 A | 3/2014 |
| TW | 201724449 A | 7/2017 |
| TW | 201820571 A | 6/2018 |
| WO | 2017171696 A1 | 10/2017 |

* cited by examiner

PHOTONIC INTEGRATED PACKAGE AND METHOD FORMING SAME

PRIORITY CLAIM AND CROSS-REFERENCE

This application is a continuation of U.S. application Ser. No. 16/290,028, filed on Mar. 1, 2019, entitled "Photonic Integrated Package and Method Forming Same," which claims the benefit of the following provisionally filed U.S. patent application: Application Ser. No. 62/690,770, filed Jun. 27, 2018, and entitled "Photonic Integrated Fan-out Package;" which application is hereby incorporated herein by reference.

BACKGROUND

Electrical signaling and processing have been the mainstream techniques for signal transmission and processing. Optical signaling and processing have been used in increasingly more applications in recent years, particularly due to the use of optical fiber-related applications for signal transmission.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
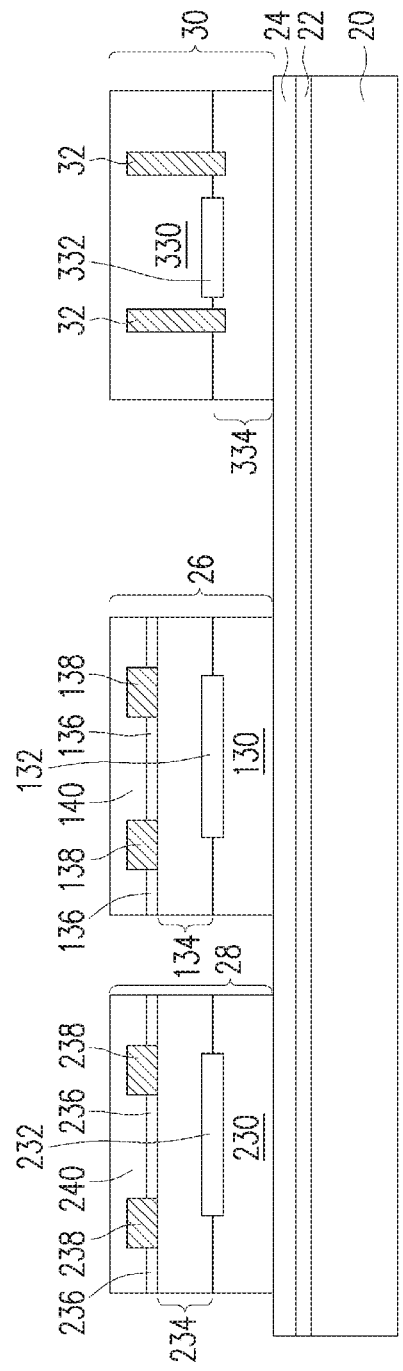
FIGS. 1 through 7 illustrate the cross-sectional views of intermediate stages in the formation of a photonic package including a top coupler in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package including a photonic die and an electrical die as well as the method of forming the same are provided in accordance with some embodiments. The intermediate stages of forming the packages are illustrated in accordance with some embodiments. Some variations of some embodiments are discussed. Throughout the various views and illustrative embodiments, like reference numbers are used to designate like elements.

Figure 23:
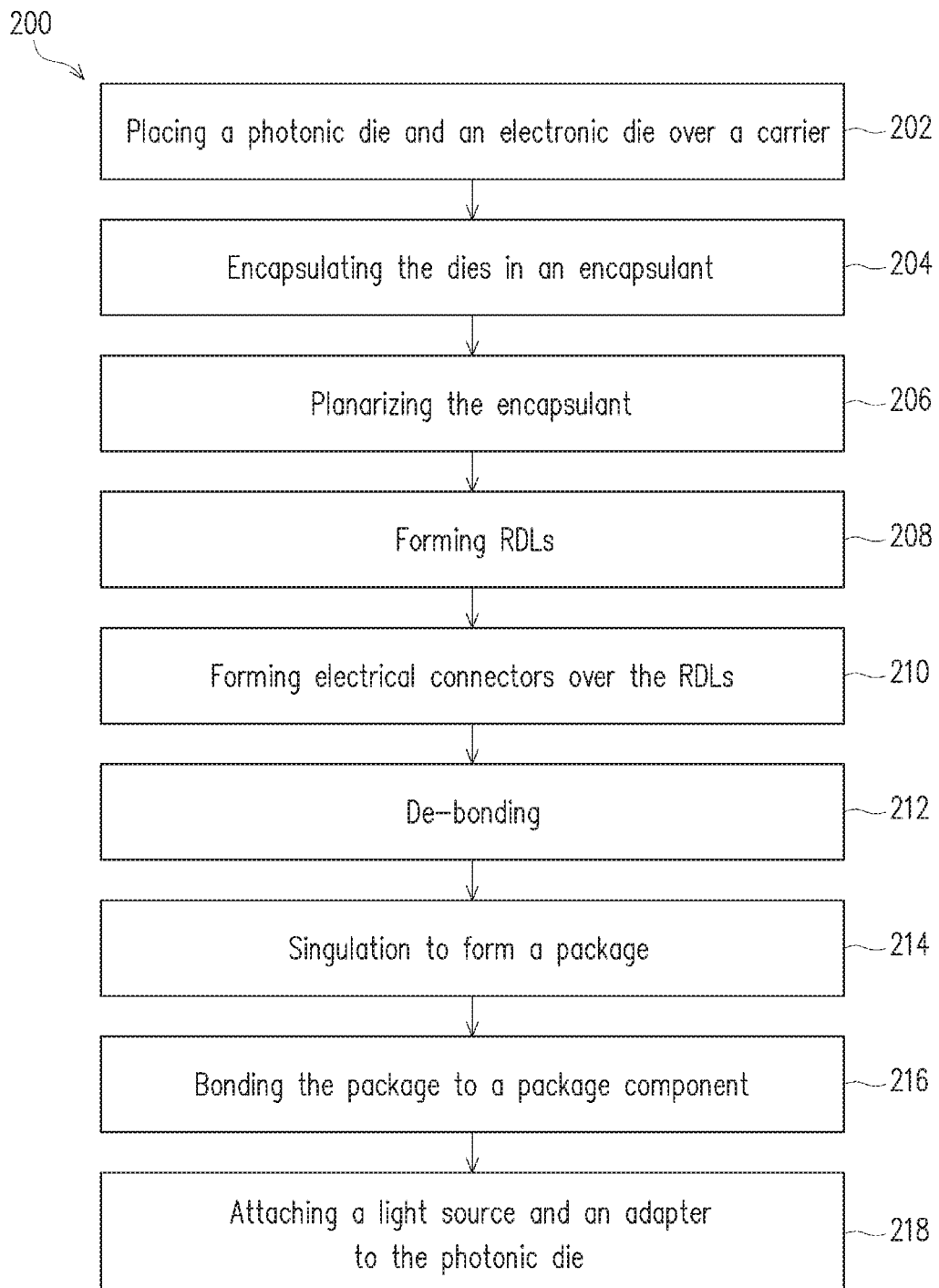
FIG. 23 illustrates a process flow for forming a photonic package in accordance with some embodiments.

FIGS. 1 through 7 illustrate the cross-sectional views of intermediate stages in the formation of a package in accordance with some embodiments of the present disclosure. The processes shown in FIGS. 1 through 7 are also reflected schematically in the process flow 200 shown in FIG. 23.

FIG. 1 illustrates carrier 20 and release film 22 formed over carrier 20. Carrier 20 may be a glass carrier, a ceramic carrier, or the like. Carrier 20 may have a round top-view shape. Release film 22 may be formed of a polymer-based material (such as a Light-To-Heat-Conversion (LTHC) material), which may be removed along with carrier 20 from the overlying structures that will be formed in subsequent steps. In accordance with some embodiments of the present disclosure, release film 22 is formed of an epoxy-based thermal-release material. Release film 22 may be dispensed in a flowable form and cured. In accordance with alternative embodiments of the present disclosure, release film 22 is a laminate film and is laminated onto carrier 20. The top surface of release film 22 is leveled and has a high degree of co-planarity. In accordance with some embodiments of the present disclosure, die-attach film 24 is formed over release film 22. Die-attach film 24 is an adhesive film, which may be coated or laminated onto release film 22.

Further referring to FIG. 1, electronic die 26, device die 28, and photonic die 30 are attached to die-attach film 24. The respective process is illustrated as process 202 in the process flow shown in FIG. 23. In accordance with some embodiments of the present disclosure, electronic die 26 acts as a central processing unit, which includes controlling circuits for controlling the operation of the devices in photonic die 30. In addition, electronic die 26 may include the circuits for processing the electrical signals converted from the optical signals in photonic die 30. For example, electronic die 26 may include driver circuitry for controlling optical modulators in the photonics die 30 and gain amplifiers for amplifying the electrical signals received from the photodetectors in photonic die 30. Electronic die 26 may also exchange electrical signals with photonic die 30.

Electric die 26 may include semiconductor substrate 130, which may be a silicon substrate or a substrate formed of other semiconductor materials such as germanium, SiGe, a III-V compound semiconductor material, or the like. The back surface of substrate 130 (which is also the back surface of electronic die 26) is in contact with die-attach film 24. Circuitry (integrated circuit devices such as transistors) 132 may include at least a portion at the front surface of substrate 130. Interconnect structure 134 is formed on the front side of substrate 130, and may include dielectric layers (such as low-k dielectric layers, not shown) and metal lines and vias (not shown), etc. Electrical connectors 138 are electrically coupled to integrated circuit devices 132 through interconnect structure 134. Electrical connectors 138 may be metal pillars, which are embedded in dielectric layer 140. Dielectric layer 140 may be formed of polybenzoxazole (PBO), polyimide, benzocyclobutene (BCB), or the like. Passivation layer 136 is also illustrated, wherein metal pillars 138 may extend into passivation layer 136. Passivation layer 136 may be formed of silicon nitride, silicon oxide, or multi-layers thereof.

In accordance with some embodiments of the present disclosure, an additional die 28 is placed on die-attach film 24. In accordance with alternative embodiments, no additional die 28 is placed on die-attach film 24 except electronic die 26 and photonic die 30. Die 28 may be an Application Specific Integrated Circuit (ASIC) die designed for the function of the respective package. Die 28 may include semiconductor substrate 230, which may be a silicon substrate or a substrate formed of other semiconductor materials such as germanium, SiGe, or a III-V compound semiconductor material. The back surface of substrate 230 (which is also the back surface of die 28) may be in contact with die-attach film 24. Integrated circuit devices 232 (which may include transistors) may include at least a portion at the front surface of substrate 230. Interconnect structure 234 is formed on the front side of substrate 230, and may include dielectric layers (such as low-k dielectric layers, not shown), metal lines and vias (not shown), etc. Electrical connectors 238 are electrically coupled to integrated circuit devices 232 through interconnect structure 234. Electrical connectors 238 may be metal pillars, which are embedded in dielectric layer 240. Dielectric layer 240 may be formed of PBO, polyimide, BCB, or the like. Metal pillars 238 may extend into passivation layers 236. Passivation layers 236 may be formed of silicon nitride, silicon oxide, or multi-layers thereof.

Photonic die 30 is also attached to die-attach film 24. A back surface of semiconductor substrate 330 is exposed, wherein the back surface of semiconductor substrate 330 is also the back surface of photonic die 30. In accordance with some embodiments of the present disclosure, the front surface of photonic die 30 is in contact with die-attach film 24. Photonic die 30 has the function of receiving optical signals, transmitting the optical signals inside photonic die 30, transmitting the optical signals out of photonic die 30, and/or communicating electronically with electronic die 26 and device die 28. Accordingly, photonic die 30 is also responsible for the Input-Output (IO) of the optical signals and/or electrical signals.

Figure 19:
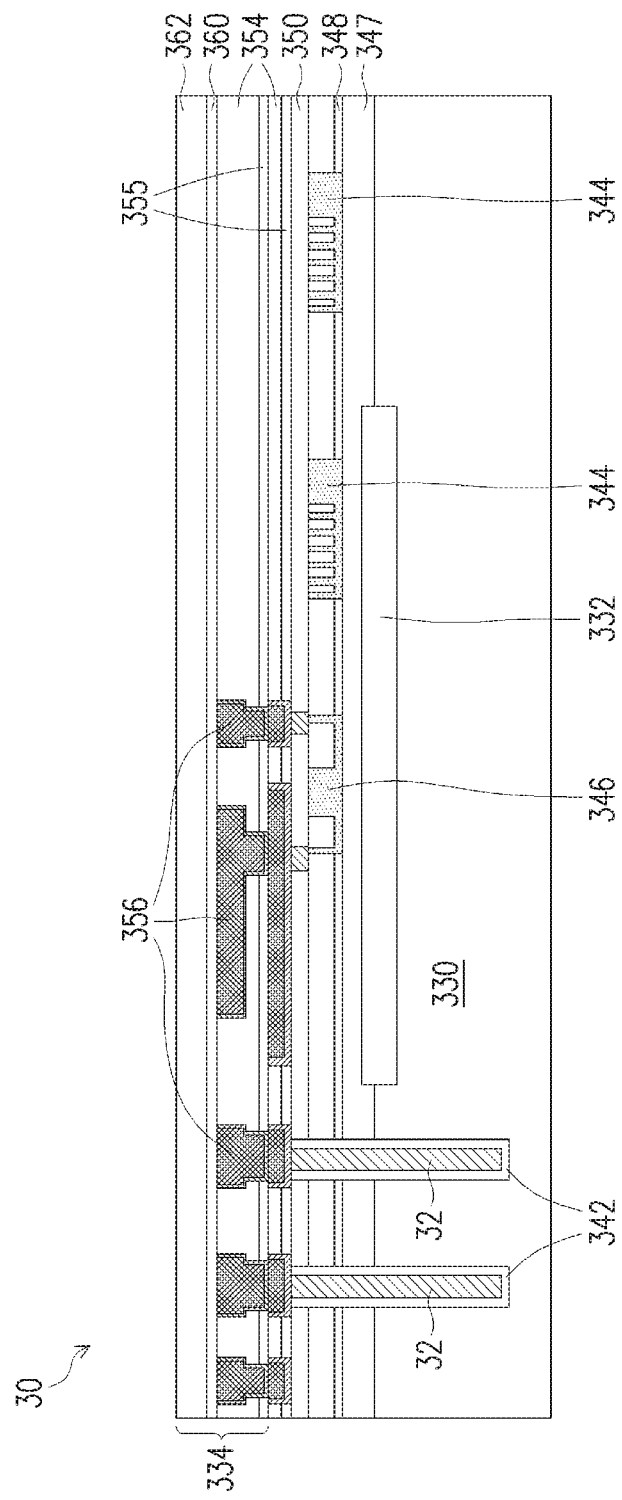
FIGS. 19 through 22 illustrate the cross-sectional views of some photonic dies before and after bonding in accordance with some embodiments.

The details of photonic die 30 are schematically illustrated in FIG. 19 in accordance with some embodiments. As shown in FIG. 19, photonic die 30 may include substrate 330. Substrate 330 may be a semiconductor substrate, which may be a silicon substrate, a silicon germanium substrate, or a substrate formed of other semiconductor materials. In accordance with some embodiments of the present disclosure, photonic die 30 includes through-Vias (also referred to as through-substrate vias or through-silicon vias) 32 extending into substrate 330. Through-vias 32 are formed of a conductive material, which may also be a metallic material such as tungsten, copper, titanium, or the like. Isolation layers 342 encircle through-vias 32, and electrically isolate through-vias 32 from substrate 330.

In accordance with some embodiments of the present disclosure, integrated circuit devices 332 are formed at the top surface of substrate 330. Integrated circuit devices 332 may include active devices such as transistors and/or diodes (which may include photo diodes). Integrated circuit devices 332 may also include passive devices such as capacitors, resistors, or the like.

Over substrate 330 resides dielectric layer 347 (which may also represent a plurality of dielectric layers). In accordance with some embodiments of the present disclosure, dielectric layer 347 is formed of silicon oxide, silicon nitride, or the like. Silicon layer 348 is formed over, and may contact, dielectric layer 347. Silicon layer 348 may be patterned, and is used to form the waveguides for the internal transmission of optical signals. Accordingly, silicon layer 348 is also referred to as waveguide(s) 348 hereinafter. Grating couplers 344 are formed on silicon layer 348, and the top portions of grating couplers 344 have grating, so that grating couplers 344 have the function of receiving light or transmitting light. Some grating couplers 344 are used for receiving light from the overlying light source or optical signal source (such as optical fiber 58 as shown FIG. 7), and transmitting the light to waveguide 348. Although waveguide 348 is illustrated as spanning across photonic die 30, waveguide 348 may actually be formed in selected regions. Modulator(s) 346 are also formed, and are used for modulating the optical signals. It is appreciated that the structure in FIG. 19 is schematically, and photonic die 30 may include various other devices and circuits that may be used for processing and transmitting optical signals and electrical signals, which are also contemplated in accordance with some embodiments of the present disclosure.

FIG. 19 also illustrates interconnect structure 334 formed over grating couplers 344. Interconnect structure 334 electrically interconnects some devices 332 and through-vias 32. Interconnect structure 334 includes a plurality of dielectric layers 354 and metal lines and vias (in combination referred to as 356) therein. Dielectric layer 350 is formed of a light-transparent material such as silicon oxide. Dielectric layers 354 are also referred to as Inter-Metal Dielectrics (IMDs), and may be formed of silicon oxide, silicon oxynitride, silicon nitride, or the like, or low-k dielectric materials having k values lower than about 3.0. The low-k dielectric materials may include Black Diamond (a registered trademark of Applied Materials), a carbon-containing low-k dielectric material, Hydrogen SilsesQuioxane (HSQ), MethylSilsesQuioxane (MSQ), or the like. Etch stop layers 355 may be formed to separate neighboring IMDs, and are formed of a material(s) having a high etching selectivity relative to the dielectric layers. The etch stop layers may be formed of silicon carbide, silicon carbo-nitride, etc. Metal lines and vias 356 may be formed using damascene processes, and may include, for example, copper on diffusion barrier layers. The diffusion barrier layers may be formed of titanium, titanium nitride, tantalum, tantalum nitride, or the like. In accordance with some embodiments, Through-vias 32 may extend to metal lines 356 in the bottom conductive features in interconnect structure 334.

Interconnect structure 334 may further include passivation layers 360 and 362 formed over interconnect structure 334. Passivation layers 360 and 362 may be formed of transparent non-low-k dielectric materials. For example, passivation layers 360 and 362 may include a silicon oxide layer and a silicon nitride layer, respectively.

Figure 2:
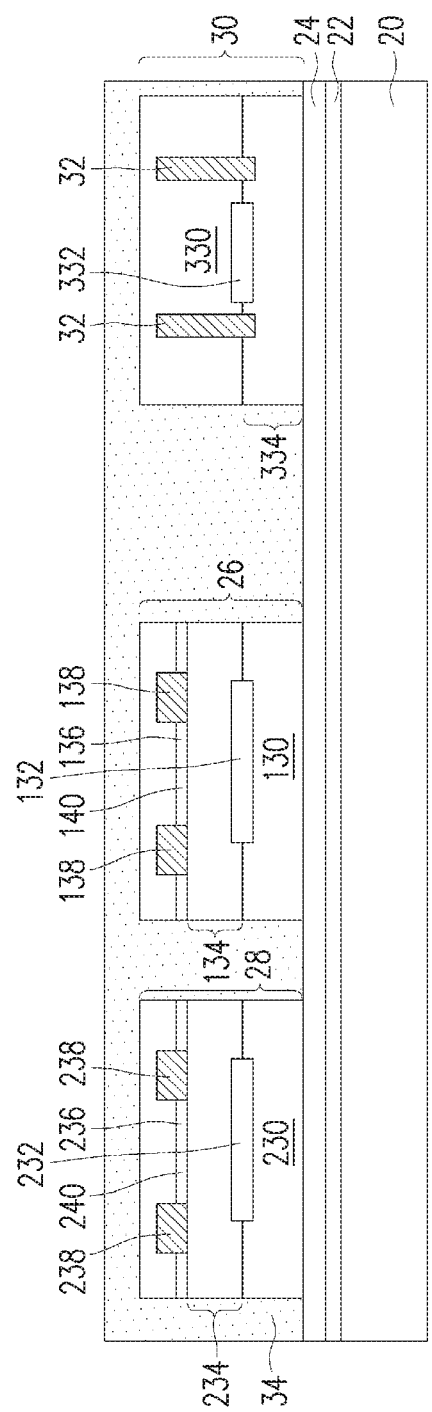

Next, referring to FIG. 2, encapsulating material (encapsulant) 34 is encapsulated (sometimes referred to as molded) on dies 26, 28, and 30. The respective process is illustrated as process 204 in the process flow shown in FIG. 23. Encapsulant 34 fills the gaps between neighboring dies 26, 28, and 30. Encapsulant 34 may include a base material, which may be a polymer, an epoxy, and/or a resin, and filler particles mixed in the base material. The filler particles may be formed of silica, aluminum oxide, or the like, and may have spherical shapes. The filler particles may also have different sizes/diameters. The top surface of encapsulant 34 is higher than the top ends of dies 26, 28, and 30.

Figure 3:
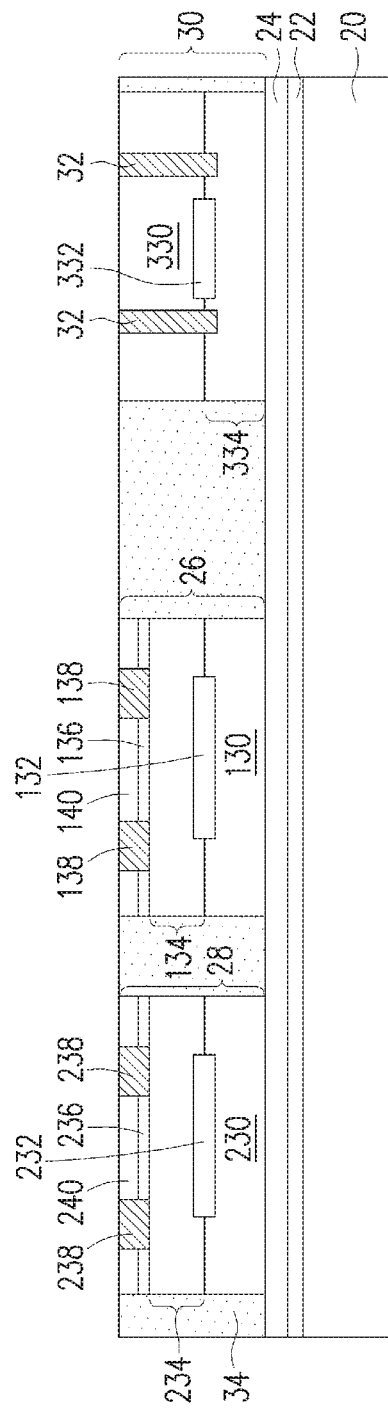

In a subsequent step, as shown in FIG. 3, a planarization process such as a Chemical Mechanical Polish (CMP) process or a mechanical grinding process is performed to reduce the top surface of encapsulant 34 and dies 26, 28, and 30. The respective process is illustrated as process 206 in the process flow shown in FIG. 23. Metal pillars 138 and 238 as well as through-vias 32 are exposed as a result of the planarization. Due to the planarization, the top ends of through-vias 32 are substantially level (coplanar) with the top surfaces of metal pillars 138 and 238, and are substantially coplanar with the top surface of encapsulant 34.

Figure 4:
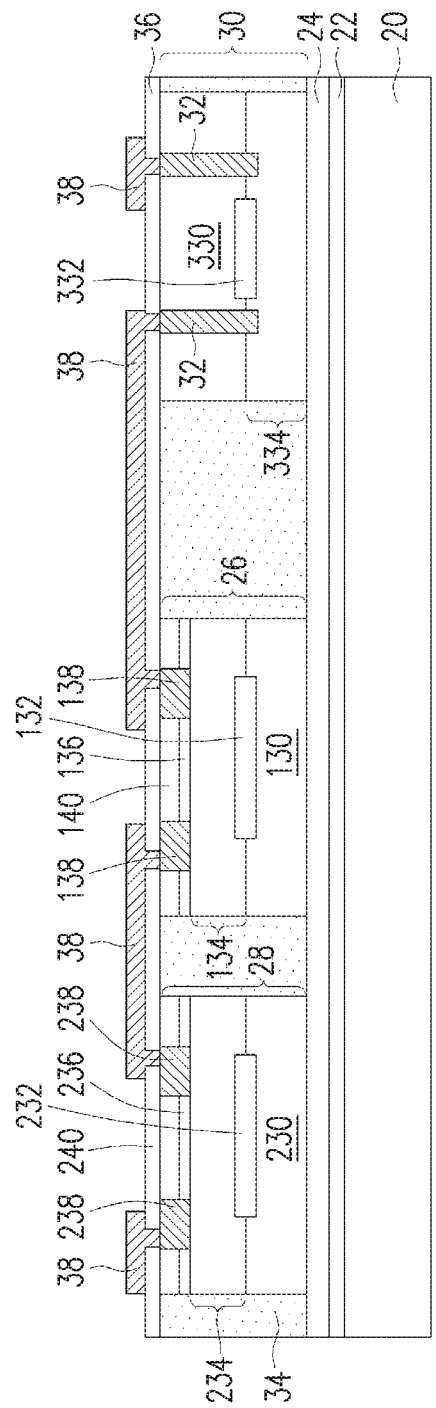
Figure 5:
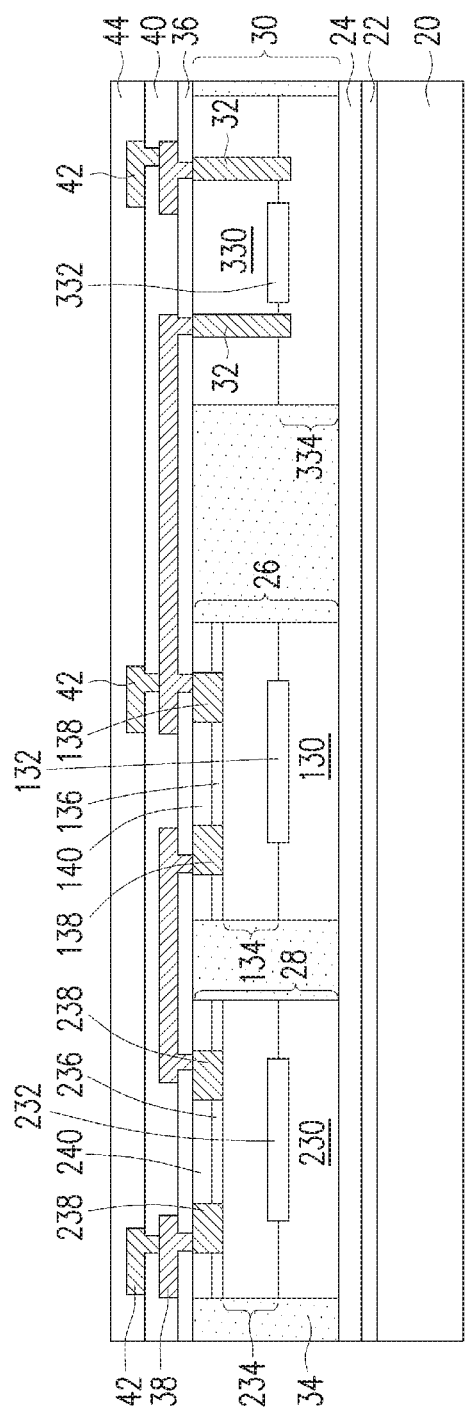
Figure 6:
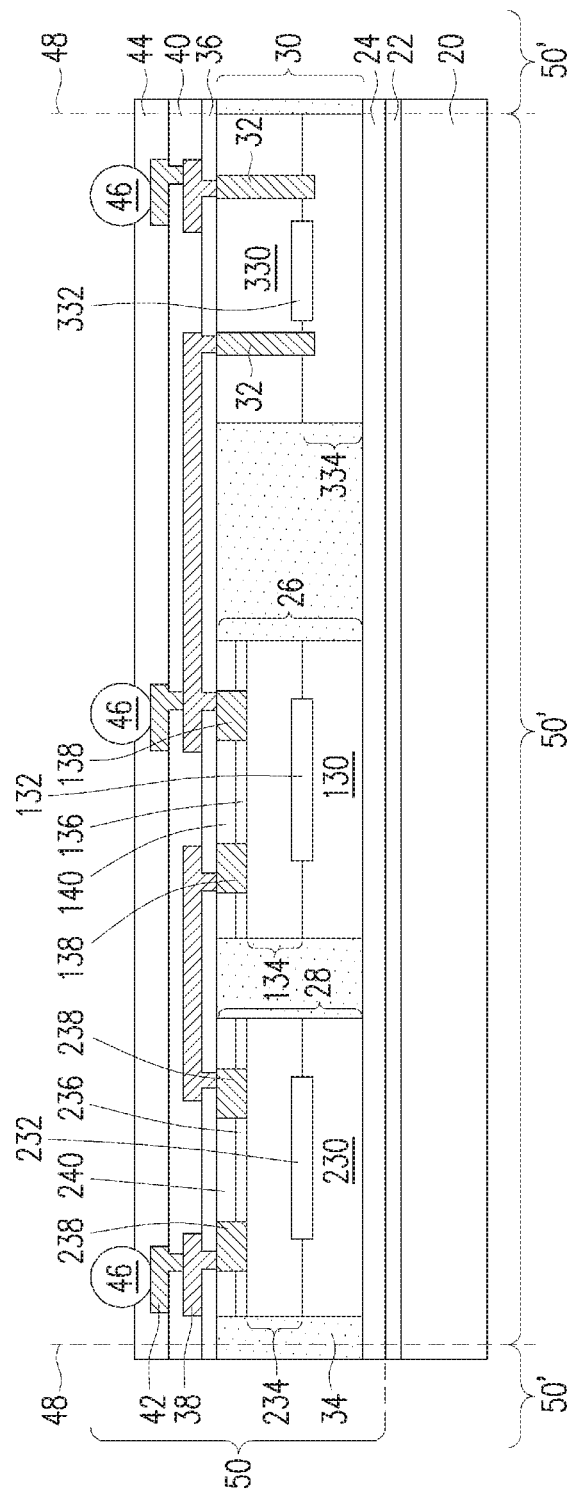

FIGS. 4 through 6 illustrate the formation of Redistribution Lines (RDLs) and the respective dielectric layers. The respective process is illustrated as process 208 in the process flow shown in FIG. 23. A brief discussion of process 208 is as follows. Referring to FIG. 4, dielectric layer 36 is formed. In accordance with some embodiments of the present disclosure, dielectric layer 36 is formed of a polymer such as PBO, polyimide, or the like. In accordance with alternative embodiments of the present disclosure, dielectric layer 36 is formed of an inorganic material such as silicon nitride, silicon oxide, or the like.

Next, further referring to FIG. 4, RDLs 38 are formed to extend into dielectric layer 36 and to connect to metal pillars 138 and 238 and through-vias 32. RDLs 38 may also interconnect metal pillars 138 and 238 and through-vias 32. RDLs 38 include metal traces (metal lines) over dielectric layer 36 and vias extending into dielectric layer 36. The vias in RDLs 38 may be in contact with through-vias 32 and metal pillars 138 and 238. In accordance with some embodiments of the present disclosure, the formation of RDLs 38 includes patterning dielectric layer 36 to form openings, through which metal pillars 138/238 and through-vias 32 are exposed. The formation of RDLs 38 further includes forming a blanket metal seed layer, forming and patterning a plating mask over the blanket metal seed layer, performing a plating process to form RDLs 38, removing the plating mask, and etching the portions of the blanket metal seed layer not covered by RDLs 38. RDLs 38 may be formed of a metal or a metal alloy including aluminum, copper, tungsten, and/or alloys thereof.

Referring to FIG. 5, in accordance with some embodiments of the present disclosure, dielectric layer 40 is formed over the structure shown in FIG. 4, followed by the formation of RDLs 42 extending into dielectric layer 40 to contact RDLs 38. Dielectric layer 40 may be formed using a material selected from the same group of candidate materials for forming dielectric layer 36. RDLs 42 may also be formed of a metal or a metal alloy including aluminum, copper, tungsten, and/or alloys thereof, and the method of forming RDLs 42 may be similar to the formation of RDLs 38. It is appreciated that although in the illustrated embodiments, two layers of RDLs (38 and 42) are formed, the RDLs may have any number of layers such as one layer or more than two layers. The RDLs in combination may electrically interconnect through-vias 32 and device dies 26, 28, and 30. Next, dielectric layer 44 is formed on RDLs 42. The material of dielectric layer 44 may be selected from the same group of candidate materials for forming dielectric layer 36.

FIG. 6 illustrates the formation of electrical connectors 46 in accordance with some embodiments. The respective process is illustrated as process 210 in the process flow shown in FIG. 23. The formation of electrical connectors 46 may include forming openings in dielectric layer 44 to expose RDLs 42, placing solder balls on the exposed portions of the UBMs, and then reflowing the solder balls. Under-Bump Metallurgies (UBMs, not shown) may be formed between the solder regions and RDLs 42. In accordance with alternative embodiments of the present disclosure, the formation of electrical connectors 46 includes performing a plating step to form solder regions over the exposed metal pads in RDLs 42, and then reflowing the solder regions. Electrical connectors 46 may also include metal pillars, or the combinations of metal pillars and solder caps, which may also be formed through plating. Throughout the description, the structures overlying die-attach film 24 in combination are referred to as reconstructed wafer 50. Reconstructed wafer 50 includes a plurality of groups of dies, with each group including device dies 26, 28, and 30 in accordance with some embodiments.

Next, reconstructed wafer 50 is de-bonded from carrier 20. The respective process is illustrated as process 212 in the process flow shown in FIG. 23. To de-bond reconstructed wafer 50, reconstructed wafer 50 is first placed on a tape (not shown), which is attached to a frame (not shown). In accordance with some embodiments of the present disclosure, electrical connectors 46 are in contact with the tape. Next, a light is projected on release film 22, and the light penetrates through the transparent carrier 20. In accordance with some exemplary embodiments of the present disclosure, the light is a laser beam, which scans through the entire release film 22. During the light exposure, release film 22 is decomposed in response to the heat introduced by the light exposure, allowing carrier 20 to be separated from the underlying structure. The residue of release film 22 is then removed, for example, through a plasma cleaning step. Reconstructed wafer 50 is thus de-bonded (demounted) from carrier 20.

Die-attach film 24 is then removed in a cleaning process or a backside grinding process.

Figure 7:
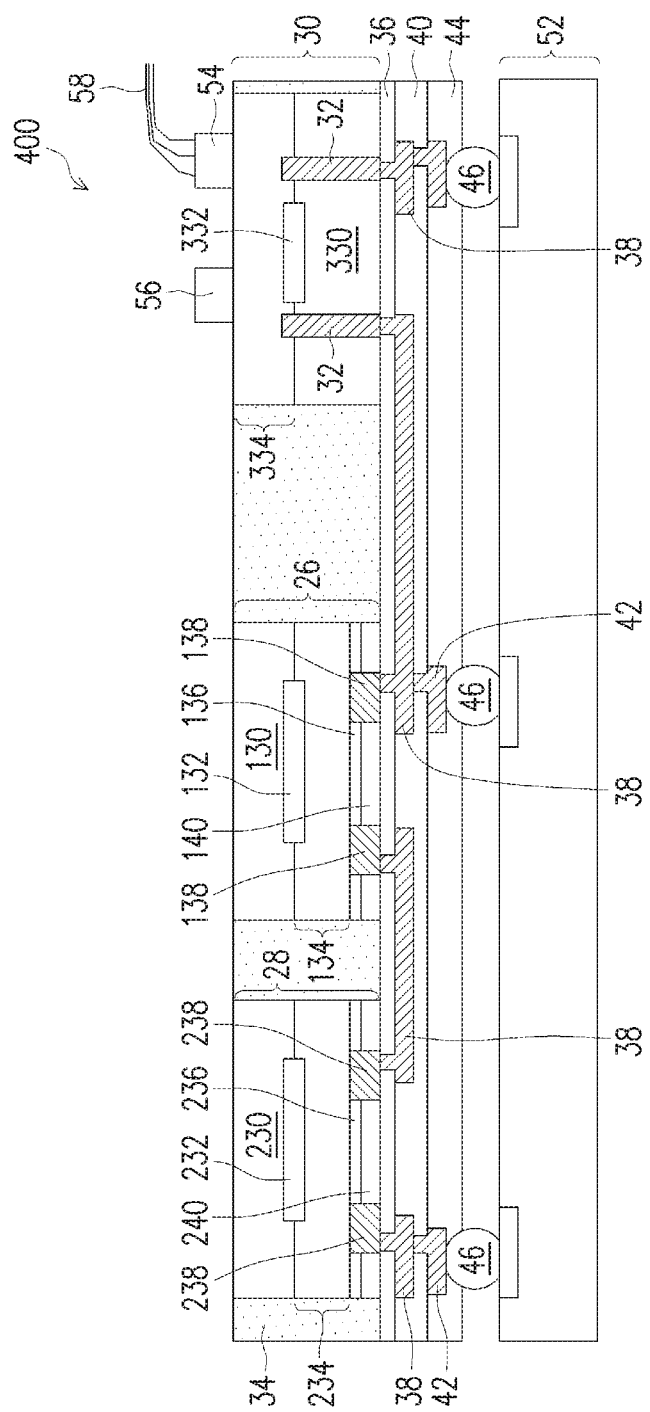

Reconstructed wafer 50 is then singulated along scribe lines 48 in accordance with some embodiments of the present disclosure, so that a plurality of packages 50' that are identical to each other are formed. The respective process is illustrated as process 214 in the process flow shown in FIG. 23. In a subsequent process, as shown in FIG. 7, package 50' is bonded to package component 52, which may be an interposer, a package substrate, a printed circuit board, or the like. The respective process is illustrated as process 216 in the process flow shown in FIG. 23.

Figure 20:
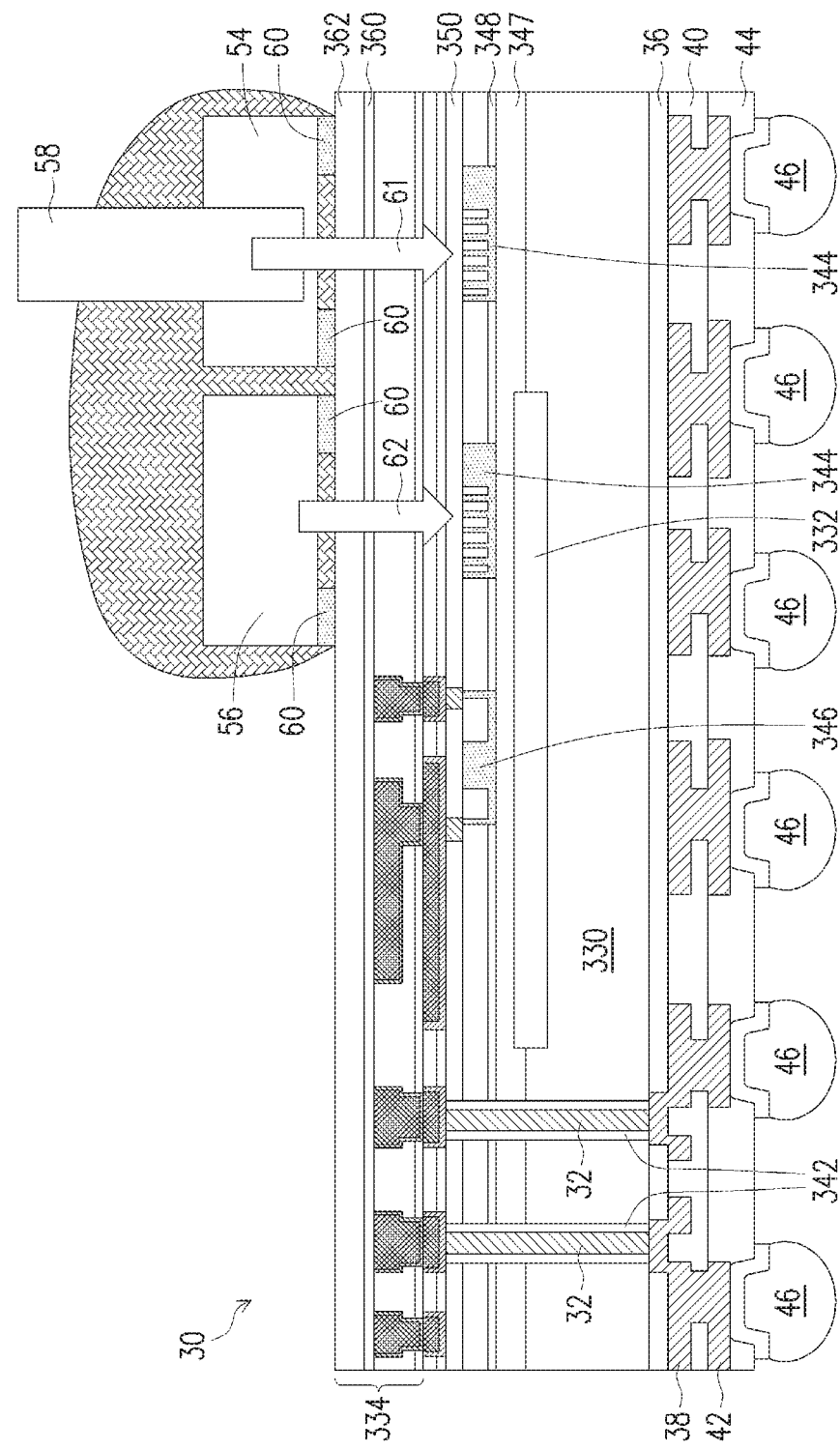

FIG. 7 also illustrates the attachment of (optical) coupler 54 and light source 56 to package 50', so that package 400 is formed. The respective process is illustrated as process 218 in the process flow shown in FIG. 23. Coupler 54 is used for the input/output of optical signals for photonic die 30. Coupler 54 is used to secure optical fiber(s) 58 on photonic die 30. FIG. 20 illustrates an amplified view of some portions of photonic die 30, coupler 54, and light source 56 as in FIG. 7. The attachment of coupler 54 and light source 56 to photonic die 30 may be through, for example, adhesive films 60. Optical fibers 58 may aim at, and may be optically coupled to the corresponding grating coupler 344. The light 61 transmitted in optical fiber 58 is projected onto grating coupler 344, and/or the light emitted out of grating coupler 344 is received by optical fiber 58.

In addition, light source 56, which may be a lamp, is attached to photonic die 30, and is aligned to a corresponding grating coupler 344. Light source 56 is configured to project light 62 (which may be a laser beam) to grating coupler 344, with light 62 being projected onto one or a plurality of underling grating couplers 344.

Figure 8:
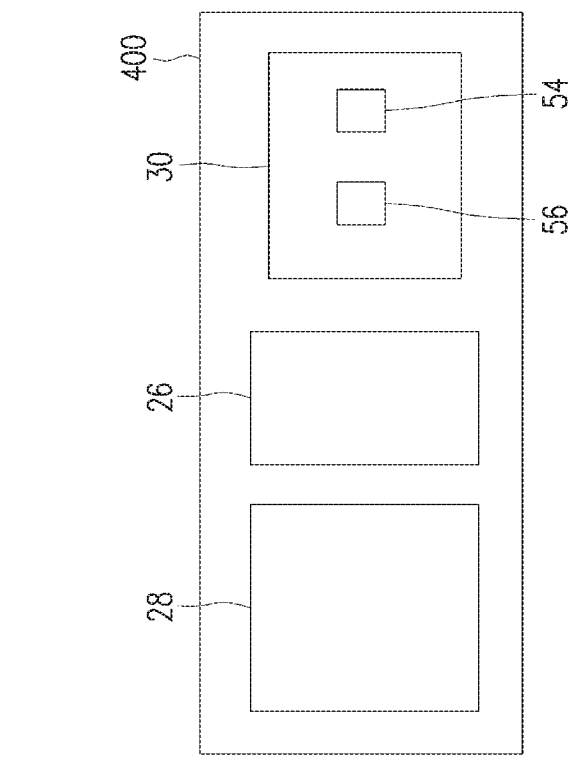
FIG. 8 illustrates a top view of a photonic package in accordance with some embodiments.

In accordance with some embodiments of the present disclosure, optical adhesive 60, which is a clear (and hence is transparent) adhesive, is used to fix coupler 54 and light source 56 onto photonic die 30. Optical adhesive 60 may be dispensed over and surrounding coupler 54 and light source 56. FIG. 8 illustrates a top view of package 400, which includes die 28, electronic die 28, and photonic die 30.

In accordance with some embodiments of the present disclosure as shown in FIG. 7, the back surface of photonic die 30 faces the same direction as the top surfaces of electronic die 26 and device die 28. Photonic die 30 is electrically connected to electronic die 26 and device die 28 through through-vias 32 and RDLs 38 and 42. Furthermore, there may not be any electrical connector on the front surface (facing up) of photonic die 30, and there may not be any electrically conductive feature in photonic die 30 contacting dielectric layer 36. In accordance with some embodiments of the present disclosure, all electrical connections of photonic die 30 are made downwardly through through-vias 32.

Figure 9A:
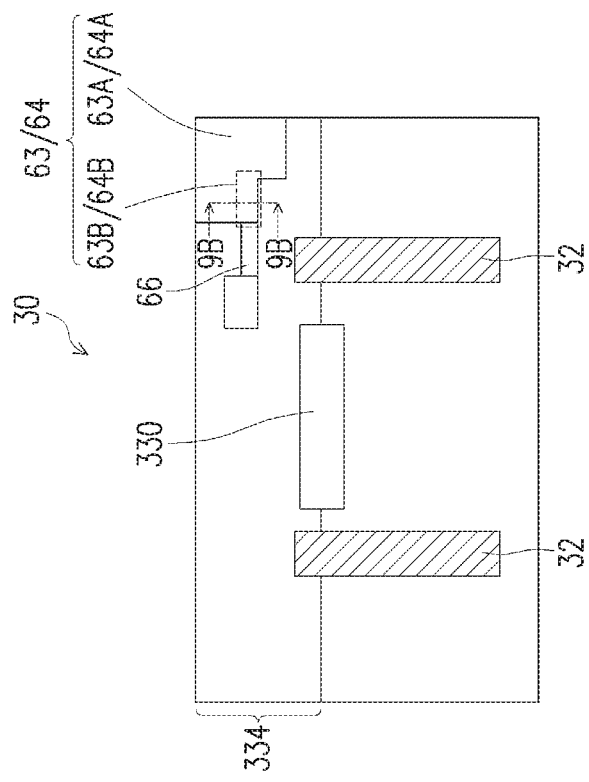
FIGS. 9A, 9B, and 9C illustrate various views of a photonic die in accordance with some embodiments.
Figure 9C:
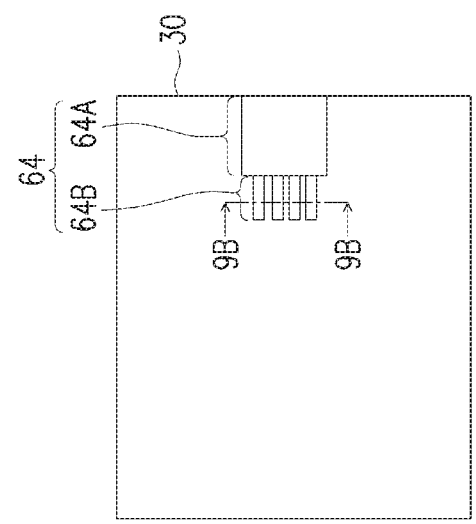
Figure 9B:
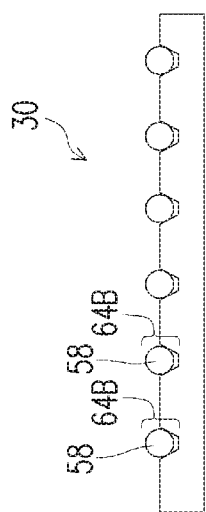

FIGS. 9A, 9B, and 9C illustrate cross-sectional views and a top view of photonic die 30 in accordance with some embodiments. Referring to FIG. 9A, an opening 64 is formed in photonic die 30, and sacrificial material 63 fills opening 64. Sacrificial material 63 may extend from the top surface and an edge of photonic die 30 into photonic die 30. Opening 64 may include a bulk portion 64A and one or a plurality of grooves 64B connected to an end of the bulk portion 64A. For example, FIG. 9C illustrates the bulk portion 64A as having a rectangular top-view shape, and a plurality of grooves 64B are connected to the bulk portion 64A (also refer to FIG. 21 for details). Correspondingly, sacrificial material 63 also has a bulk portion 63A and portions 63B filling grooves 64B. Sacrificial material 63 may be formed of a polymer or any other material that can be easily removed in subsequent processes without damaging other parts of photonic die 30. For example, sacrificial material 63 may be formed of a Decahydronaphthalene based material, an n-Butyl acetate based material, or the like. In accordance with some embodiments, opening 64 is formed at wafer level (when photonic die 30 is still in the respective wafer), and before the wafer is sawed apart into photonic dies 30. The formation of opening 64 may include laser ablation, etching, mechanical cutting, or the like. Sacrificial material 63 is filled into the openings 64 in photonic dies 30, and a planarization process may be performed to level the top surface of sacrificial material 63 with the top surface of photonic dies 30.

FIG. 9B illustrates a cross-sectional view of grooves 64B, wherein the cross-sectional view are obtained from the plane containing line 9B-9B, as shown in FIGS. 9A and 9C. In the cross-sectional view, the grooves 64B may have V-shapes or U-shapes (with the top width greater than bottom width). The size and the shape of grooves 64B are designed so that at least a part, or an entirety, of optical fiber 58 can be placed into a groove.

Figure 21:
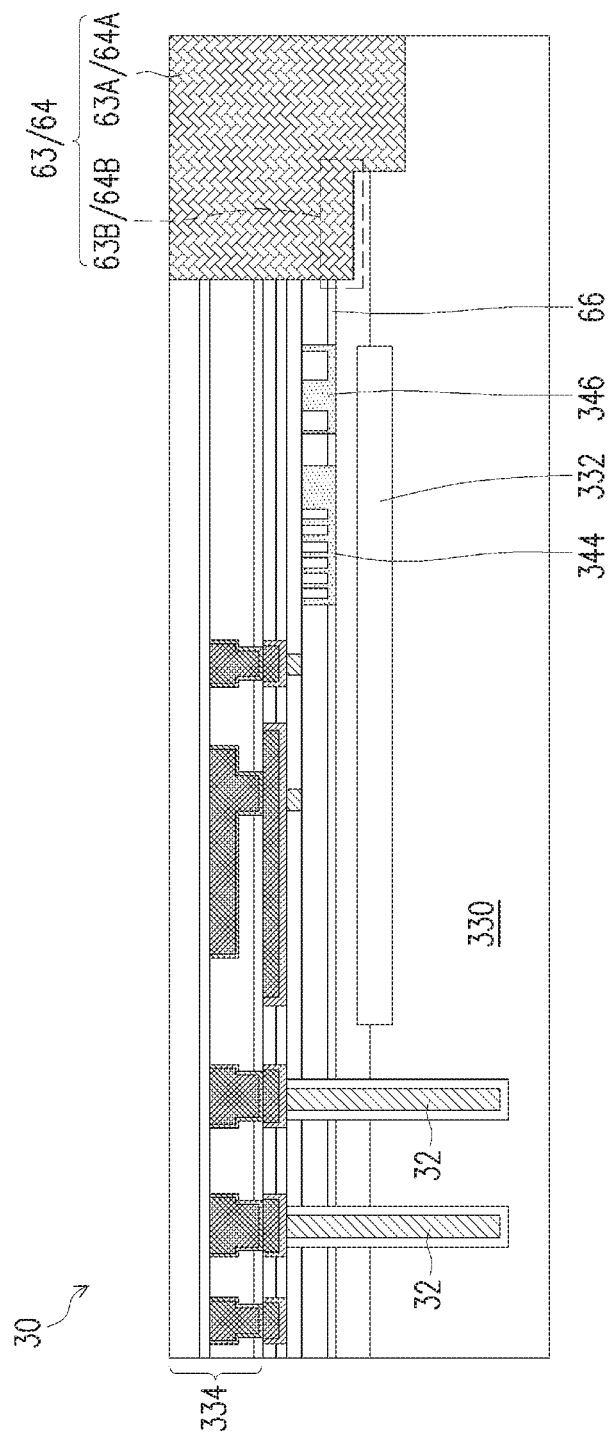

FIG. 21 schematically illustrates some details of photonic die 30. Grooves 64B have ends facing waveguide(s) 66, which are formed of silicon, silicon oxynitride, or the like. Optical components such as modulators 346 may be connected to the ends of waveguides 66.

FIGS. 10 through 14 illustrate cross-sectional views of intermediate stages in the formation of a package including an edge coupler in accordance with some embodiments of the present disclosure. These embodiments are similar to the embodiments shown in FIGS. 1 through 7, except that edge couplers are used. Unless specified otherwise, the materials and the formation methods of the components in these embodiments are essentially the same as the like components, which are denoted by like reference numerals in the embodiments shown in FIGS. 1 through 7. The details regarding the formation process and the materials of the components shown in FIGS. 10 through 14 (and also in FIGS. 15 through 18) may thus be found in the discussion of the embodiments shown in FIGS. 1 through 7.

Figure 10:
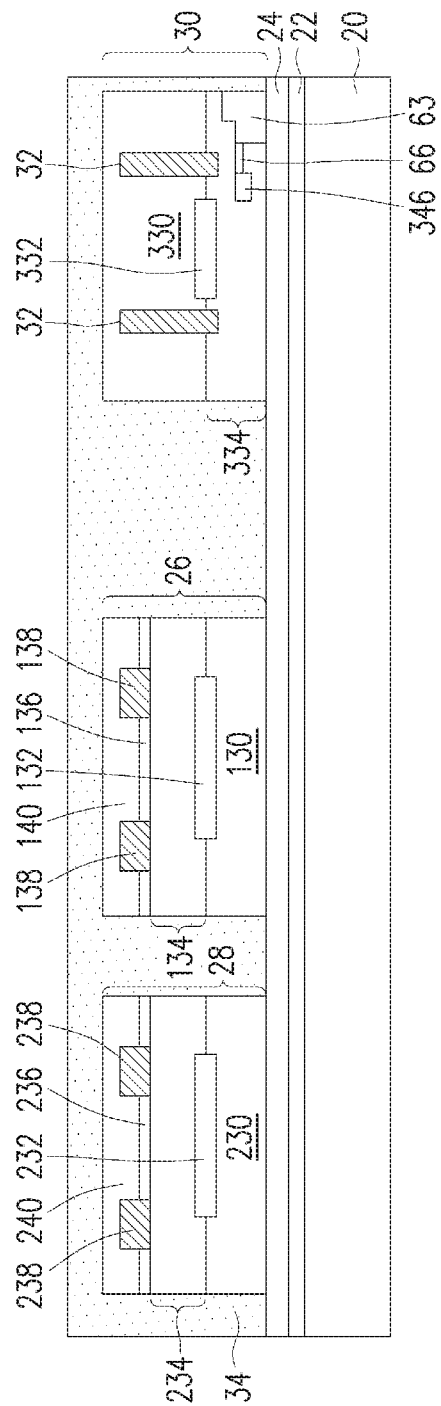
FIGS. 10 through 14 illustrate the cross-sectional views of intermediate stages in the formation of a photonic package including an edge coupler in accordance with some embodiments.

Referring to FIG. 10, carrier 20 is provided, and release film 22 and die-attach film 24 are formed/attached on carrier 20. Electronic die 26, device die 28, and photonic die 30 are then placed on die-attach film 24. The back surfaces of electronic die 26 and device die 28 and the top surface of photonic die 30 face die-attach film 24, and may be in contact with die-attach film 24. Encapsulant 34 is then encapsulated on dies 26, 28, and 30.

Figure 11:
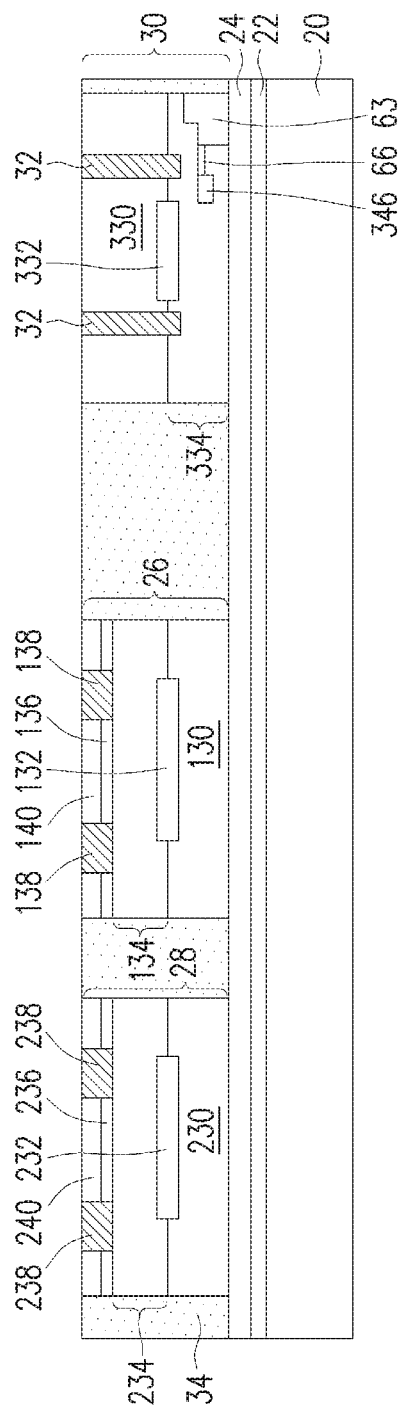
Figure 12:
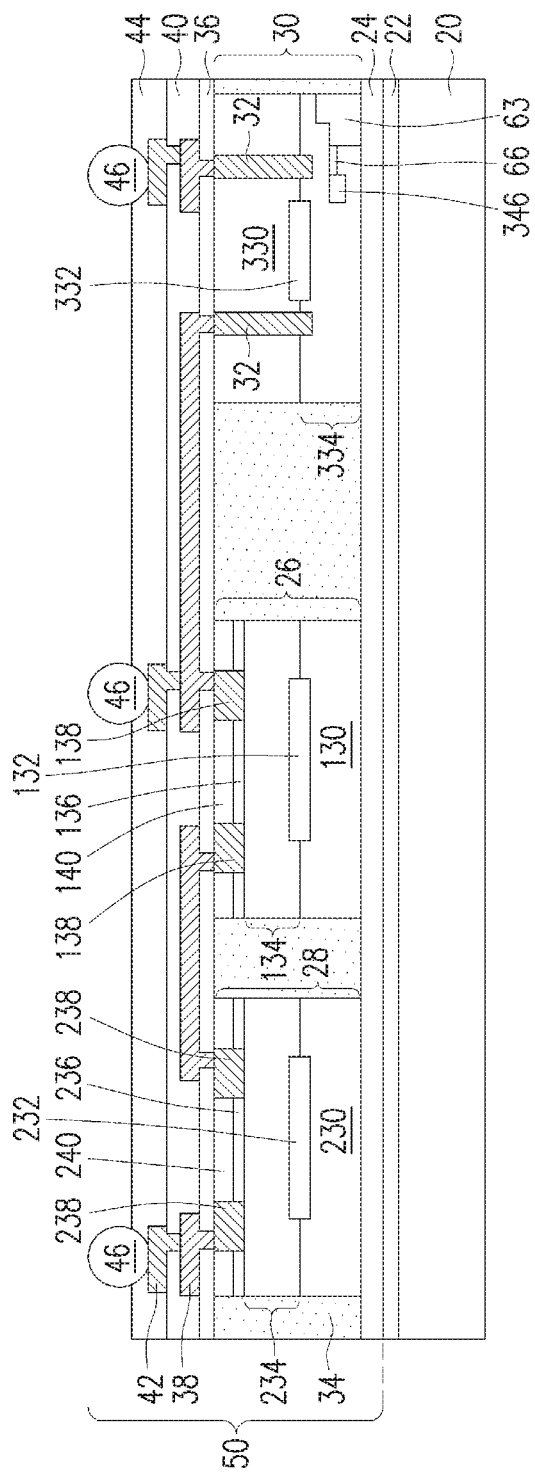

FIG. 11 illustrates the planarization process for removing excess portions of encapsulating material and some portions of dies 26, 28, and 30, so that metal pillars 138/238 and through-vias 32 are exposed. Next, as shown in FIG. 12, RDLs 38 and 42 and dielectric layers 36, 40, and 44, and electrical connectors 46 are formed. The process details have been discussed referring to the embodiments shown in FIGS. 4 through 6, and are not repeated herein. Reconstructed wafer 50 is thus formed.

Figure 13:
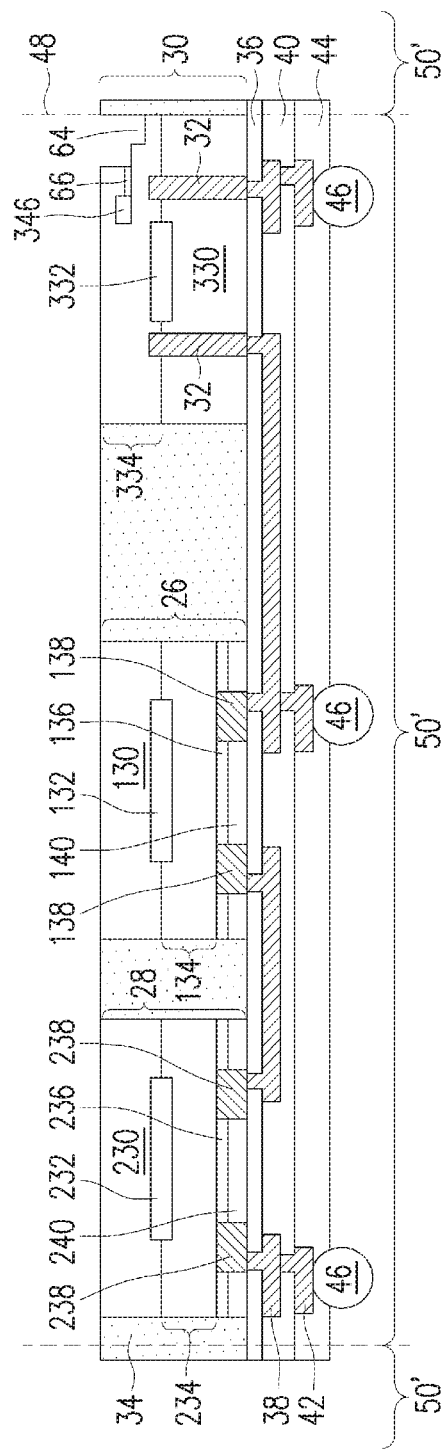

In subsequent processes, reconstructed wafer 50 is de-bonded from carrier 20, and residue portions of die-attach film 24 are removed, for example, in a chemical cleaning process or a mechanical grinding process. Next, sacrificial material 63 is removed, for example, using a solvent that can dissolve sacrificial material 63 or a (wet) chemical etchant that can etch sacrificial material 63 without damaging photonic die 30. For example, when sacrificial material 63 is formed of the Decahydronaphthalene based material, a monoterpene hydrocarbon based chemical may be used to remove sacrificial material 63 through etching or dissolving. The resulting structure is shown in FIG. 13, with opening 64 revealed.

Next, reconstructed wafer 50 is singulated to separate packages 50' therein from each other. Some of scribe lines 48 may pass the edges of photonic die 30, so that opening 64 is revealed from the side of photonic die 30.

Figure 14:
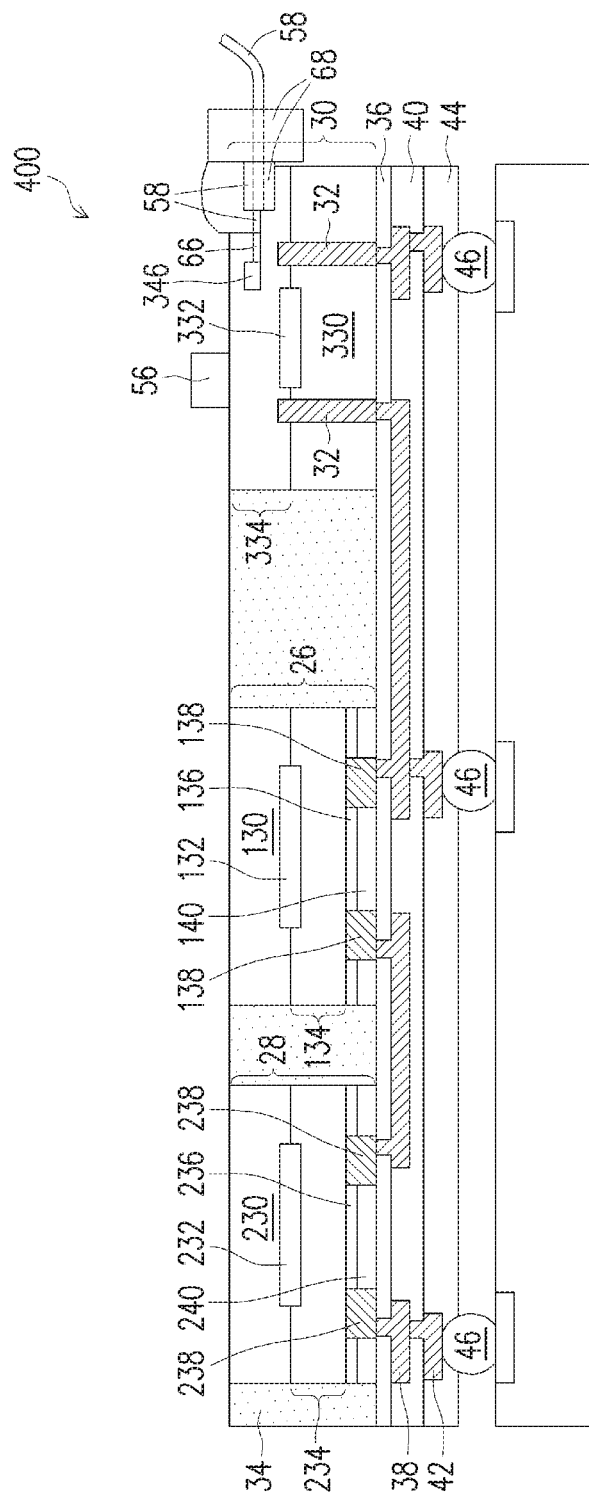
Figure 22:
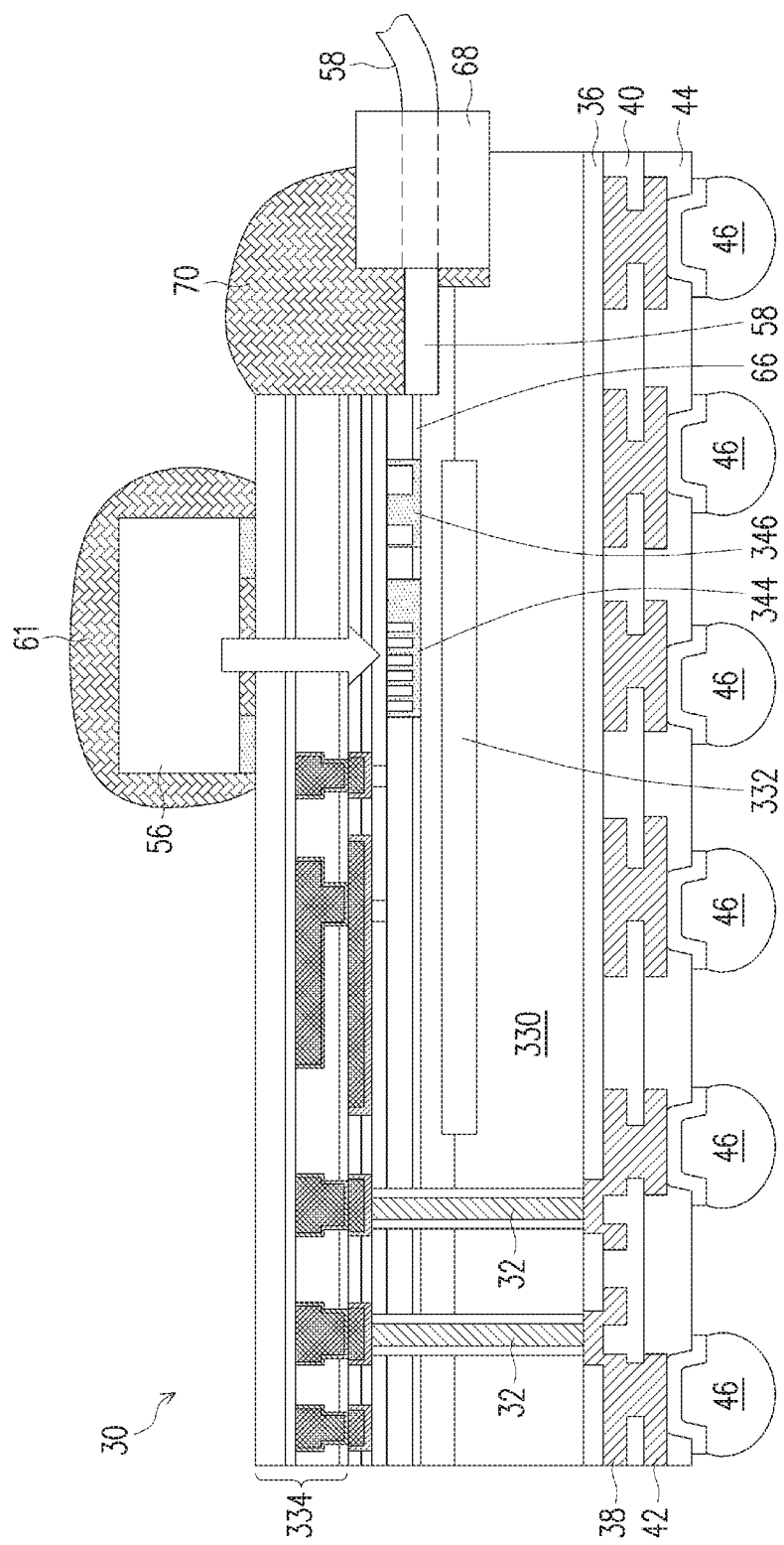

FIG. 14 illustrates the attachment of edge coupler 68 to photonic die 30 to form package 400. Edge coupler 68 may include a ferrule and a ferrule lid for clamping and securing optical fibers 58 therebetween. Each of optical fibers 58 may be placed into (at least partially) one of grooves 64B, as shown in FIG. 9B. As shown in FIG. 14, the ends of optical fibers 58 face waveguides 66, so that light may be transmitted into waveguides 66 from optical fibers 58, and/or optical fibers 58 may receive the light transmitted from waveguides 66. FIG. 14 also illustrates that light source 56 is attached to photonic die 30. FIG. 22 illustrates the amplified view of photonic die 30 and edge coupler 68. Furthermore, adhesive 70 may be used to secure edge coupler 68 to photonic die 30.

FIGS. 15 through 18 illustrate packages 400 in accordance with some embodiments of the present disclosure.

Figure 15:
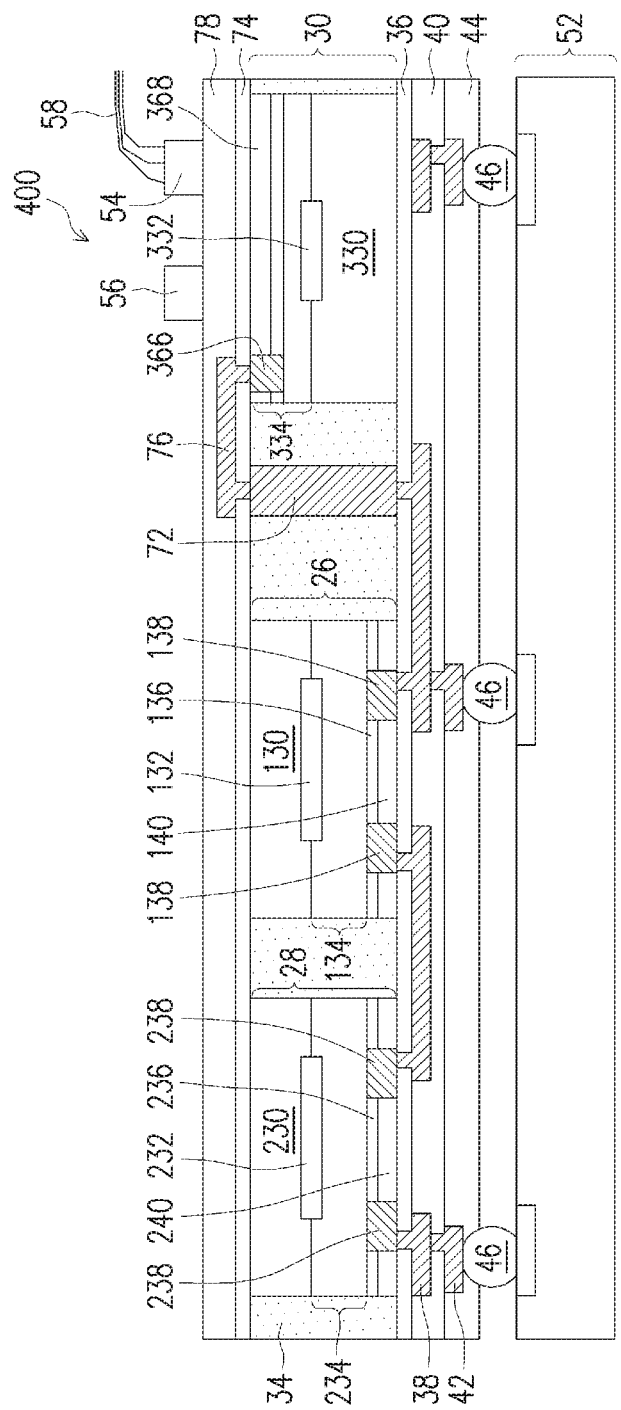
FIGS. 15 through 18 illustrate the cross-sectional views of some photonic packages in accordance with some embodiments.

FIG. 15 illustrates some embodiments in which top coupler 54 is used. In accordance with some embodiments of the present disclosure, photonic die 30 does not include through-vias in semiconductor substrate 330. The electrical connection of the circuit in photonic die 30 to electronic die 26 and die 28 is through through-vias 72 (alternatively referred to as metal posts), which penetrate through encapsulant 34. The formation of through-vias 72 may include, before placing dies 26, 28, and 30 (FIG. 1 or 10), depositing a metal seed layer over die-attachment film 24, forming a patterned plating mask such as photo resist on the metal seed layer, plating the through-vias/metal posts 72 in the openings in the patterned photo resist, removing the plating mask, and etching the portions of the metal seed layer that were previously covered by the plating mask.

As shown in FIG. 15, photonic die 30 includes electrical connectors 366 at the surface. Electrical connectors 366 may be metal pillars or metal pads formed of, for example, copper, nickel, titanium, alloys thereof, and/or multi-layers thereof. Dielectric layer 368 is also formed at the surface of photonic die 30, and fills the gaps between neighboring electrical connectors 366. Dielectric layer 368 may be formed of a polymer such as PBO, polyimide, or the like.

As shown in FIG. 15, dielectric layer 74 is formed over dies 26, 28, and 30, RDLs 76 are formed to extend into dielectric layer 74. RDLs 76 interconnects photonic die 30 to electronic die 26 and die 28 through through-vias 72 and RDLs 38 and 42. Dielectric layer 78 is formed to cover RDLs 76 and dielectric layer 74. The materials and the formation processes of RDLs 76 may be similar to that of RDLs 38 and 42. The materials and the formation processes of dielectric layers 74 and 78 may be similar to that of dielectric layers 36, 40, and/or 44. Light source 56 and coupler 54 are attached to the top of dielectric layer 78.

Figure 16:
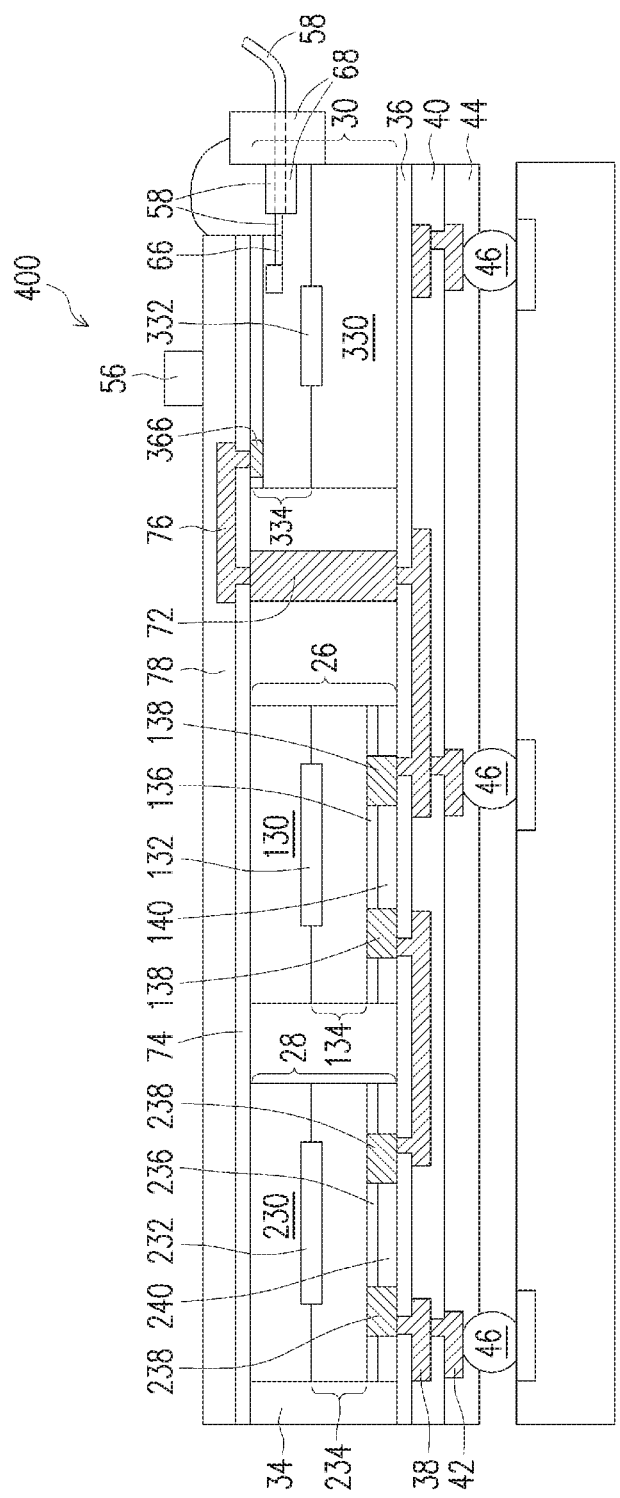

FIG. 16 illustrates package 400 in accordance with some embodiments of the present disclosure. The package 400 in FIG. 16 is similar to the package 400 in FIG. 14, except that the photonic die 30 in FIG. 16 does not include through-vias penetrating through substrate 330, and the electrical connection to photonic die 30 is through RDLs 76 and through-vias 72. Edge coupler 68 is used. The details of through-vias 72 and RDLs 76 may be found in the embodiments shown in FIG. 15.

Figure 17A:
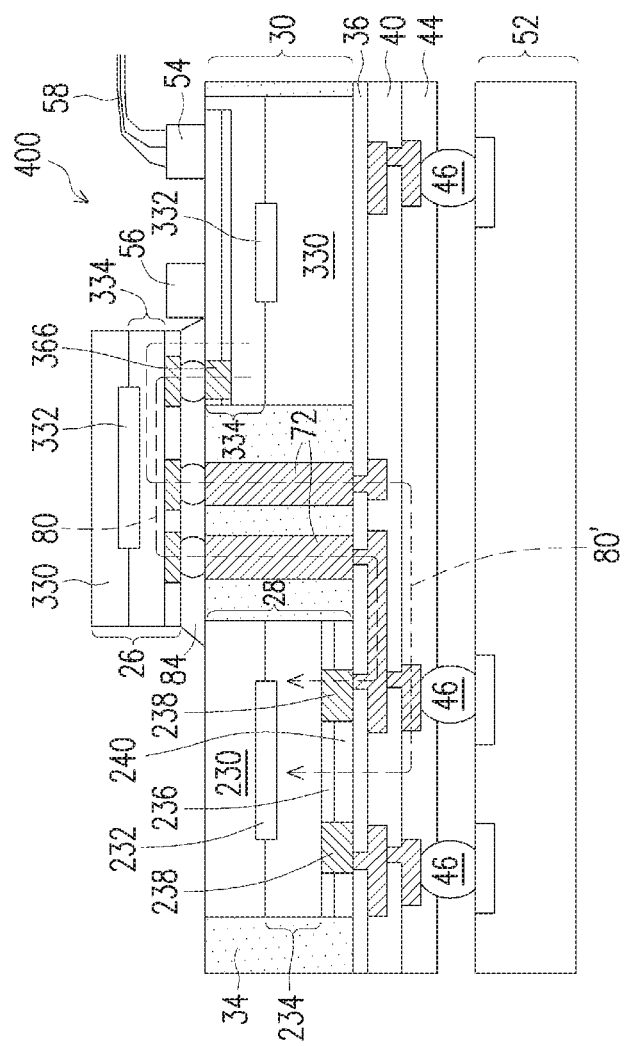

FIG. 17A illustrates package 400 in accordance with some embodiments. These embodiments are similar to the embodiments in FIG. 15, except that electronic die 26, instead of being encapsulated in encapsulant 34, is over and bonded to photonic die 30. In accordance with some embodiments of the present disclosure, electronic die 26, besides its function for processing electrical signals that are related to optical signals, also acts as the bridge for electrically coupling photonic die 30 to device die 28. Accordingly, electrical signal path 80 is schematically illustrated to show the electrical connection between photonic die 30 and die 28 using electronic die 26 as a bridge. In addition, some of electrical paths 80', although physically passing inside electronic die 26, may be electrically disconnected from all of circuits (such as transistors, diodes, resistors, capacitors, inductors, and the like) in electronic die 26. These electrical paths 80' are used solely for interconnecting dies 28 and 30, and are not used to connect dies 28 and 30 to die 26. Other electrical paths 80, besides interconnecting dies 28 and 30, may also be electrically connected to the internal circuits (such as transistors, diodes, resistors, capacitors, inductors, and the like) in electronic die 26. Electronic die 26 may be bonded to photonic die 30 and through-vias 72 through solder regions 82. Underfill 84 may be dispensed between electronic die 26 and photonic die 30. Light source 56 and top coupler 54 are attached to photonic die 30.

Figure 17B:
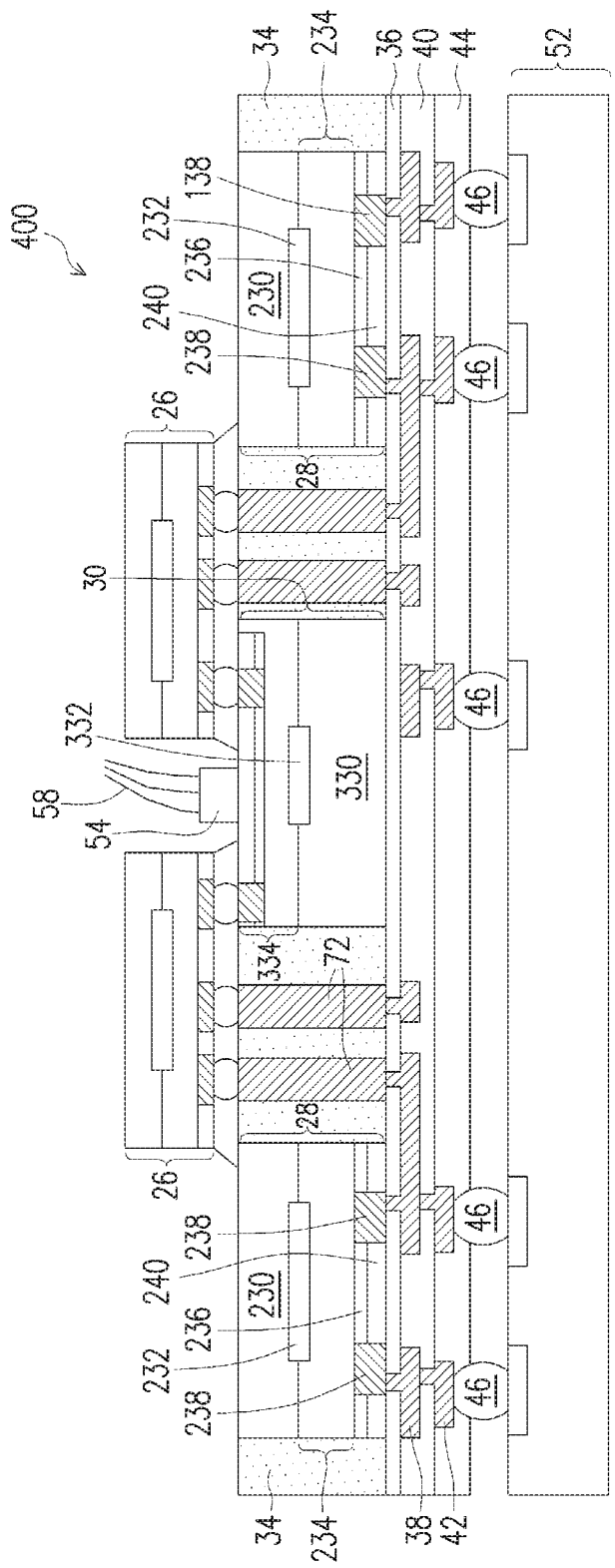

FIG. 17B illustrates package 400 in accordance with some embodiments, which is similar to the embodiment shown in FIG. 17A, except there are two electronic dies 26 and two device dies 28, with the two device dies 28 being on the opposite sides of photonic die 30.

Figure 17C:
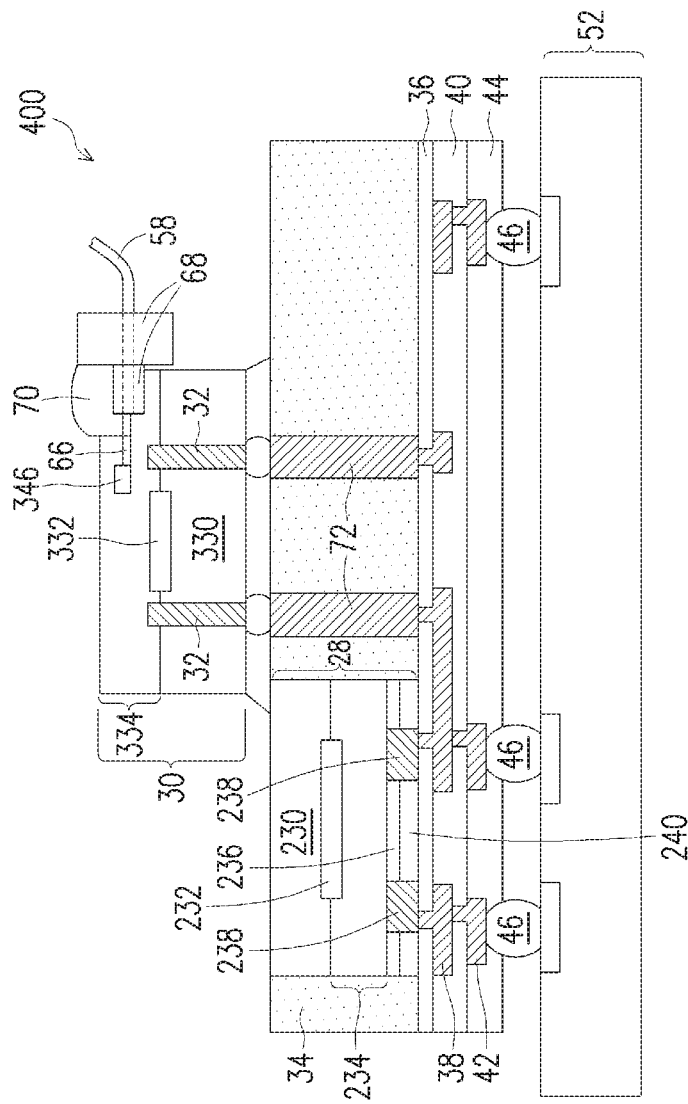

FIG. 17C illustrates package 400 in accordance with some embodiments. Package 400 includes electronic die 26 and through-vias 72 encapsulated in encapsulant 34. Photonic die 30 is over and bonded to through-vias 72, and is electrically coupled to electronic die 26 through through-vias 72 and RDLs 38 and 42. FIG. 17C illustrates edge coupler 68 attached to the side of photonic die 30.

Figure 17D:
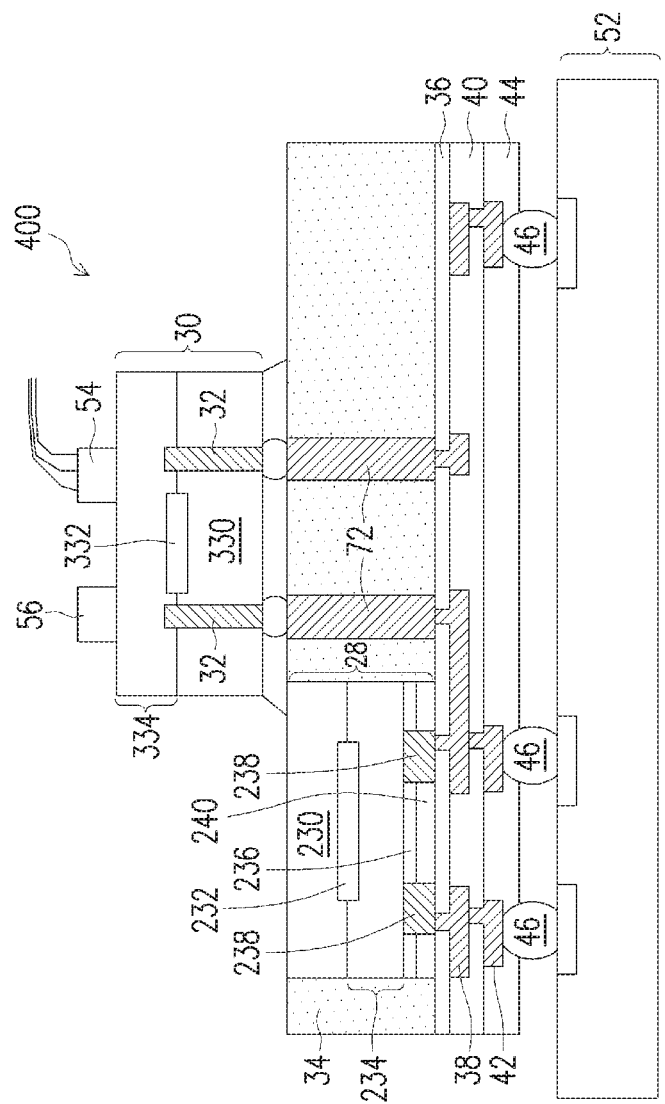

FIG. 17D illustrates package 400 in accordance with some embodiments. Package 400 includes electronic die 26 and through-vias 72 encapsulated in encapsulant 34. Photonic die 30 is over and bonded to through-vias 72, and is electrically coupled to electronic die 26 through through-vias 72 and RDLs 38 and 42. FIG. 17D illustrates coupler 54 and light source 56 attached to the top of photonic die 30.

Figure 18:
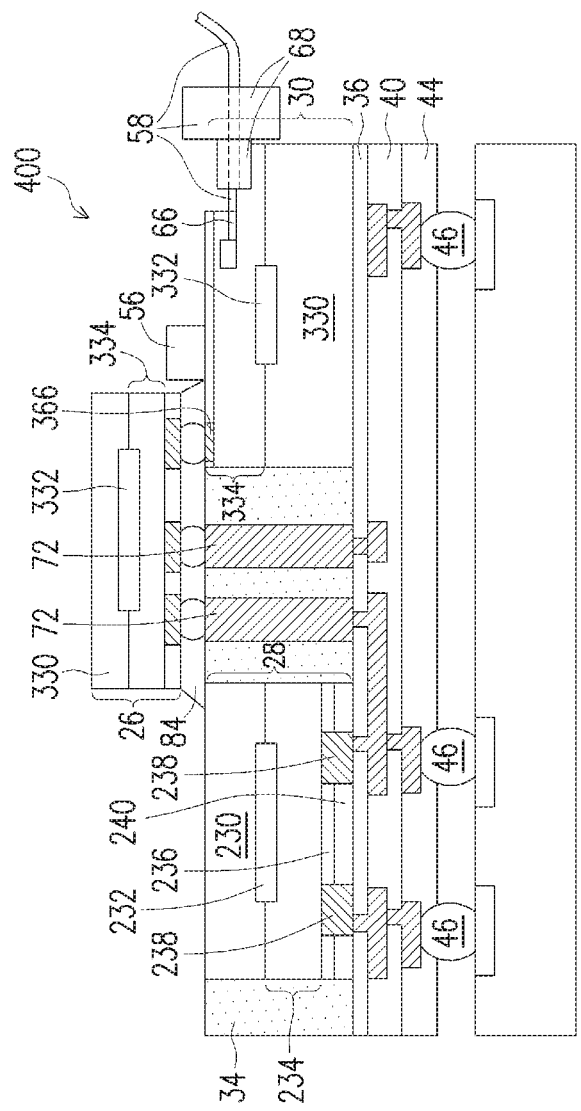

FIG. 18 illustrates package 400 in accordance with some embodiments of the present disclosure. These embodiments are similar to the embodiments shown in FIG. 17A except edges coupler 68, rather than a top coupler, is used. The details are thus not discussed, and the details may be found in the discussion referring to FIG. 17 and FIG. 14.

In above-illustrated embodiments, some processes and features are discussed in accordance with some embodiments of the present disclosure. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The optical signaling and processing are typically combined with electrical signaling and processing to provide full-fledged applications. For example, optical fibers may be used for long-range signal transmission, while electrical signals may be used for short-range signal transmission as well as processing and controlling. Accordingly, the devices integrating optical components and electrical components are formed for the conversion between optical signals and electrical signals, as well as the processing of optical signals and electrical signals. Packages thus may include both optical (photonic) dies (known as P-dies) including optical devices and electronic dies (known as E-dies) including electronic devices.

In a conventional package, an E-die is over and bonded to a P-die. The P-die may include a light source and a fiber connector, which are also attached to the P-die. Accordingly, the size of the P-die is large enough to accommodate the E-die, the light source and the fiber connector. The P-die is further bonded to an underlying package substrate through wire bonds. The components inside the P-die, however, do not need such a large area. Furthermore, the P-die is typically formed using a Silicon-on-Insulator (SOI) substrate, which is much more expensive than a bulk silicon substrate. Accordingly, the cost for manufacturing the conventional package was high.

The embodiments of the present disclosure have some advantageous features. By encapsulating a photonic die in an encapsulant and using through-vias (either in the photonic die or in the encapsulant) to connect to the photonic die, the photonic die does not have a portion overlapped by the electronic die and other dies such as ASIC dies. Accordingly, the size of the photonic die can be reduced. Since the photonic die may be formed using SOI wafers, reducing the size of the photonic dies results in the significant reduction in the manufacturing cost.

In accordance with some embodiments of the present disclosure, a method includes placing an electronic die and a photonic die over a carrier, wherein a back surface of the electronic die and a front surface of the photonic die face the carrier; encapsulating the electronic die and the photonic die in an encapsulant; planarizing the encapsulant until an electrical connector of the electronic die and a conductive feature of the photonic die are revealed; forming redistribution lines over the encapsulant, wherein the redistribution lines electrically connect the electronic die to the photonic die; and attaching an optical coupler to the photonic die, wherein an optical fiber attached to the optical coupler is configured to optically couple to the photonic die. In an embodiment, the method further comprises removing a sacrificial material of the photonic die to reveal an opening extending from the front surface and an edge of the photonic die into the photonic die, wherein a waveguide in the photonic die is revealed to the opening, and the optical coupler comprises an edge coupler having a portion extending into the opening, and the optical fiber has a portion extending into a groove in the photonic die, with the groove being a part of the opening. In an embodiment, the method further comprises, before placing the photonic die over the carrier; forming the opening in the photonic die; and filling the sacrificial material into the opening. In an embodiment, the optical coupler and the redistribution lines are on opposite sides of a substrate in the photonic die. In an embodiment, the photonic die comprises a semiconductor substrate, and the conductive feature of the photonic die comprises a through-via extending into the semiconductor substrate, and the electrical connector of the electronic die and the through-via are both revealed by the planarizing. In an embodiment, the conductive feature of the photonic die comprises a metal pad, and the method further comprises forming a metal post, wherein the encapsulant encapsulates, and contacts, the metal post therein; and forming additional redistribution lines, wherein the metal pad of the photonic die is electrically connected to the electrical connector of the electronic die through the additional redistribution lines, the metal post, and the redistribution lines. In an embodiment, the method further comprises attaching a light source on the photonic die, wherein the light source is configured to emit a light into the photonic die.

In accordance with some embodiments of the present disclosure, a method includes placing an electronic die over a carrier; placing a photonic die over the carrier, with a front surface of the photonic die facing the carrier, wherein the photonic die comprises a waveguide; and a sacrificial material extending from the front surface and an edge of the photonic die into the photonic die, wherein the sacrificial material contacts an optical component of the photonic die; encapsulating the electronic die and the photonic die in an encapsulant; planarizing the encapsulant until both an electrical connector of the electronic die and a through-via of the photonic die are revealed, wherein the through-via penetrates through a semiconductor substrate of the photonic die; forming first redistribution lines over the encapsulant, wherein one of the first redistribution lines electrically connects the electrical connector to the through-via; removing the sacrificial material; and attaching an edge coupler to the photonic die, wherein an optical fiber attached to the optical coupler is configured to optically couple to the waveguide. In an embodiment, the method further comprises de-bonding the encapsulant, the electronic die and the photonic die from the carrier, wherein the sacrificial material is removed after the de-bonding. In an embodiment, the method further comprises performing a singulation on the encapsulant, wherein an edge of the sacrificial material is revealed by the singulation. In an embodiment, a back surface of the electronic die faces the carrier. n an embodiment, the sacrificial material comprises a polymer, and the removing the sacrificial material comprises using a solvent to dissolve the sacrificial material. In an embodiment, the sacrificial material comprises a polymer, and the removing the sacrificial material comprises wet etching. In an embodiment, the method further comprises placing an Application Specific Integrated Circuit (ASIC) die over the carrier, wherein a back surface of the ASIC die faces the carrier, and in the planarizing, an additional electrical connector of the ASIC die is revealed. In an embodiment, at a time the edge coupler is attached, no electrical connection is made to a front surface of the photonic die, and the front surface and the back surface are opposite surfaces of the photonic die.

In accordance with some embodiments of the present disclosure, a device includes an electronic die comprising a metal pillar; a photonic die comprising a semiconductor substrate; and a through-via penetrating through the semiconductor substrate; an encapsulant encapsulating the electronic die and the photonic die therein; redistribution lines underlying the encapsulant, wherein one of the redistribution lines electrically connects the metal pillar of the electronic die to the through-via of the photonic die; an optical coupler attached to the photonic die; and an optical fiber attached to the optical coupler, wherein the optical fiber is configured to optically couple to the photonic die. In an embodiment, the optical coupler is attached to a front surface of the photonic die, and the photonic die is free from electronic connectors at the front surface. In an embodiment, the photonic die and the electronic die face opposite directions. In an embodiment, the optical coupler is an edge coupler comprising a portion extending into the photonic die. In an embodiment, the optical coupler is directly over the photonic die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   an electronic die;
   a photonic die comprising a first semiconductor substrate;
   an encapsulant encapsulating the electronic die and the photonic die therein;
   redistribution lines underlying the encapsulant, wherein the redistribution lines are electrically connected to the electronic die and the photonic die, and wherein a first front side of the electronic die faces toward the redistribution lines, and a second front side of the photonic die faces away from the redistribution lines;

an optical coupler attached to the photonic die;

an optical fiber attached to the optical coupler, wherein the optical fiber is configured to optically couple to the photonic die; and a light source attached to the second front side of the photonic die.

2. The device of claim 1 further comprising a through-via penetrating through the first semiconductor substrate, wherein the through-via is electrically connected to the redistribution lines.

3. The device of claim 1, wherein the photonic die comprises a conductive feature at the second front side, and the device further comprises:

a through-via penetrating through the encapsulant, wherein the through-via electrically connects the electronic die to the conductive feature of the photonic die.

4. The device of claim 1, wherein the electronic die further comprises a second semiconductor substrate, and wherein the encapsulant comprises a top surface coplanar with a surface of the second semiconductor substrate.

5. The device of claim 1 further comprising a device die encapsulated in the encapsulant, wherein the device die is electrically coupled to the electronic die through the redistribution lines.

6. The device of claim 1, wherein the light source comprises a lamp.

7. The device of claim 1, wherein the optical coupler is attached to the second front side of the photonic die.

8. The device of claim 7, wherein the optical coupler is an edge coupler attached to an edge of the photonic die.

9. A device comprising:
a first dielectric layer;
an encapsulant over the first dielectric layer;
an electronic die in the encapsulant, wherein the electronic die comprises:
a first semiconductor substrate;
a first electrical circuit at a bottom surface of the first semiconductor substrate; and
a first electrical connector underlying the first semiconductor substrate;
a photonic die in the encapsulant, wherein the photonic die comprises:
a second semiconductor substrate;
a second electrical circuit at a top surface of the second semiconductor substrate; and
a second electrical connector underlying the second semiconductor substrate; and
redistribution lines underlying and contacting the first electrical connector and the second electrical connector; and
an optical coupler overlying and attached to the photonic die.

10. The device of claim 9, wherein the photonic die further comprises a grating coupler, and the electronic die is electrically coupled to the photonic die, and comprises a circuitry for processing electrical signals received from the photonic die.

11. The device of claim 9, wherein a surface of the first semiconductor substrate is coplanar with an additional top surface of the encapsulant.

12. The device of claim 9 further comprising a second dielectric layer over and in physical contact with both of the first semiconductor substrate and the encapsulant.

13. The device of claim 9, wherein the optical coupler is attached close to an additional top surface of the photonic die.

14. The device of claim 13, wherein the photonic die is free from electronic connectors at the additional top surface of the photonic die.

15. The device of claim 13, wherein the optical coupler is an edge coupler comprising a portion extending into the photonic die.

16. The device of claim 13, wherein the optical coupler is directly over the photonic die.

17. A device comprising:
a molding compound comprising a top surface;
an electronic die in the molding compound, wherein the electronic die comprises a first semiconductor substrate, and the first semiconductor substrate comprises a back surface coplanar with the top surface of the molding compound;
a photonic die in the molding compound, wherein the photonic die comprises:
a second semiconductor substrate; and
an optical device over the second semiconductor substrate; and
an optical coupler attached to the photonic die.

18. The device of claim 17, wherein the photonic die and the electronic die face opposite directions.

19. The device of claim 17, wherein the optical device in the photonic die comprises a grating coupler.

20. The device of claim 19, wherein the electronic die and the photonic die face opposite directions.

* * * * *